United States Patent
Wang et al.

(10) Patent No.: US 11,626,427 B2
(45) Date of Patent: Apr. 11, 2023

(54) FABRICATING METHOD OF DISPLAYING BASE PLATE, DISPLAYING BASE PLATE AND DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Yangpeng Wang, Beijing (CN); Zhenhua Zhang, Beijing (CN); Baolei Huo, Beijing (CN); Linlin Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 156 days.

(21) Appl. No.: 17/330,873

(22) Filed: May 26, 2021

(65) Prior Publication Data

US 2022/0123025 A1    Apr. 21, 2022

(30) Foreign Application Priority Data

Oct. 21, 2020  (CN) .......................... 202011134132.5

(51) Int. Cl.
*H01L 27/12*   (2006.01)
*H04N 5/225*   (2006.01)

(52) U.S. Cl.
CPC ........ *H01L 27/124* (2013.01); *H01L 27/1259* (2013.01); *H04N 5/2257* (2013.01)

(58) Field of Classification Search
CPC ...................................................... H01L 27/12
See application file for complete search history.

(56) References Cited

U.S. PATENT DOCUMENTS

| | | | | |
|---|---|---|---|---|
| 2011/0109863 A1* | 5/2011 | Liu | .................. | G02F 1/136259 445/2 |
| 2014/0118658 A1* | 5/2014 | Tong | ................. | G02F 1/136259 257/59 |
| 2015/0185572 A1* | 7/2015 | Han | .................. | G02F 1/136286 349/42 |

\* cited by examiner

*Primary Examiner* — Sang V Nguyen
(74) *Attorney, Agent, or Firm* — WHDA, LLP

(57) ABSTRACT

A displaying base plate includes a transparent displaying region. The displaying base plate located within the transparent displaying region includes: a substrate base plate, including a plurality of pixel regions, wherein each of the pixel regions includes a light transmission region and a non-light transmission region; and a transparent-trace layer, a first insulating layer and a first metal-trace layer provided in stack on one side of the substrate base plate, wherein the transparent-trace layer includes a plurality of first transparent traces, the first metal-trace layer includes a plurality of first metal traces, orthographic projections of the first metal traces on the substrate base plate are located within the non-light transmission regions of different pixel regions, each two neighboring first metal traces are connected by one of the first transparent traces, and the first metal traces and the first transparent traces are connected by via holes in the first insulating layer.

20 Claims, 9 Drawing Sheets

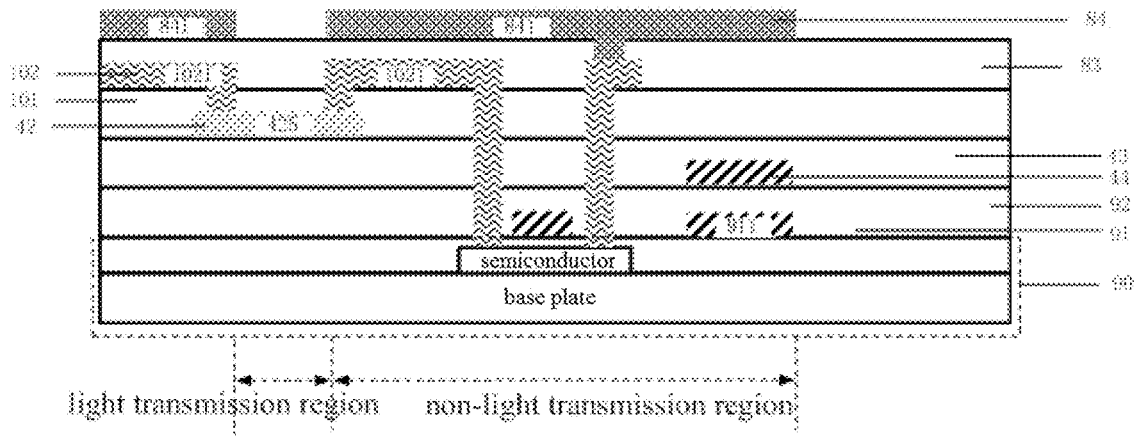

Fig. 10

| providing a substrate base plate, wherein the substrate base plate comprises a plurality of pixel regions, and each of the pixel regions comprises a light transmission region and a non-light transmission region | ~ 111 |

| forming sequentially a transparent-trace layer, a first insulating layer and a first metal-trace layer on one side of the substrate base plate, or forming sequentially a first metal-trace layer, a first insulating layer and a transparent-trace layer on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer | ~ 112 |

Fig. 11

FABRICATING METHOD OF DISPLAYING BASE PLATE, DISPLAYING BASE PLATE AND DISPLAYING DEVICE

CROSS REFERENCE TO RELEVANT APPLICATIONS

The present disclosure claims the priority of the Chinese patent application filed on Oct. 21, 2020 before the Chinese Patent Office with the application number of 202011134132.5 and the title of "FABRICATING METHOD OF DISPLAYING BASE PLATE, DISPLAYING BASE PLATE AND DISPLAYING DEVICE", which is incorporated herein in its entirety by reference.

TECHNICAL FIELD

The present disclosure relates to the technical field of displaying, and particularly relates to a fabricating method of a displaying base plate, a displaying base plate and a displaying device.

BACKGROUND

With the increasingly more demands on visual effect by consumers, ultra-narrow boundary frames or even full-screen displaying have become the development trend of display products. In order to increase the screen-to-body ratio, bang screens, water-drop screens, hole screens and so on have gradually emerged in the market. Although such forms of full screen increase the screen-to-body ratio, the appearances and the aesthetics of the mobile phones are deteriorated very much.

In order to further increase the screen-to-body ratio, under-screen cameras have become a completely new technique that giant manufacturers are competing to develop currently. The under-screen camera refers to that the front-facing camera is provided at a transparent displaying region, when the front-facing camera is not being used, the transparent displaying region over the camera can normally display an image, and when the front-facing camera is being used, the light ray of the shot object can transmit the transparent displaying region and enter the camera. Therefore, the technique of under-screen camera does not require a camera hole, and thus can realize the true effect of full-screen displaying.

SUMMARY

The present disclosure provides a fabricating method of a displaying base plate, a displaying base plate and a displaying device.

The present disclosure discloses a displaying base plate, wherein the displaying base plate comprises a transparent displaying region, and the displaying base plate located within the transparent displaying region comprises:

a substrate base plate, wherein the substrate base plate comprises a plurality of pixel regions, and each of the pixel regions comprises a light transmission region and a non-light transmission region; and a transparent-trace layer, a first insulating layer and a first metal-trace layer that are provided in stack on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer.

In an optional implementation, the transparent-trace layer further comprises a plurality of second transparent traces, and the substrate base plate comprises:

a first substrate, and a second metal-trace layer and a second insulating layer that are provided on one side of the first substrate that is closer to the transparent-trace layer, wherein the second metal-trace layer is provided closer to the first substrate, the transparent-trace layer is provided closer to the second insulating layer, the second metal-trace layer comprises a plurality of second metal traces, the second metal traces are located within the non-light transmission regions of different instances of the pixel regions, each two neighboring instances of the second metal traces are connected by one of the second transparent traces, and the second metal traces and the second transparent traces are connected by via holes provided in the second insulating layer.

In an optional implementation, the transparent-trace layer further comprises a plurality of third transparent traces, and the displaying base plate located within the transparent displaying region further comprises:

a third insulating layer and a third metal-trace layer that are provided on one side of the first metal-trace layer that is further away from the substrate base plate, wherein the third insulating layer is provided closer to the first metal-trace layer, the third metal-trace layer comprises a plurality of third metal traces, orthographic projections of the third metal traces on the substrate base plate are located within the non-light transmission regions of different instances of the pixel regions, each two neighboring instances of the third metal traces are connected by one of the third transparent traces, and the third metal traces and the third transparent traces are connected by via holes provided in the third insulating layer and the first insulating layer.

In an optional implementation, the displaying base plate located within the transparent displaying region further comprises: an anode insulating layer and an anode layer that are provided on one side of the third metal-trace layer that is further away from the substrate base plate, wherein the anode insulating layer is provided closer to the third metal-trace layer, the anode layer comprises a plurality of anodes, the anodes are connected to different instances of the third metal traces by via holes provided in the anode insulating layer, and orthographic projections of the anodes on the substrate base plate cover the non-light transmission regions of different instances of the pixel regions.

In an optional implementation, the first transparent traces, the second transparent traces and the third transparent traces are insulated from each other; and the first metal traces, the second metal traces and the third metal traces are connected to a driving circuit in each of the pixel regions.

In an optional implementation, the transparent-trace layer further comprises a plurality of fourth transparent traces, and the substrate base plate comprises:

a second substrate, and a fourth metal-trace layer and a fourth insulating layer that are provided on one side of the second substrate that is closer to the transparent-trace layer, wherein the fourth metal-trace layer is provided closer to the second substrate, the first metal-trace layer is provided closer to the fourth insulating layer, the fourth metal-trace layer comprises a plurality of fourth metal traces, the fourth metal traces are located within the non-light transmission regions of different instances of the pixel regions, each two neighboring instances of the fourth metal traces are connected by one of the fourth transparent traces, and the fourth metal traces and the fourth transparent traces are connected by via holes provided in the first insulating layer and the fourth insulating layer.

In an optional implementation, the transparent-trace layer further comprises a plurality of fifth transparent traces, and the displaying base plate located within the transparent displaying region further comprises:

a fifth insulating layer and a fifth metal-trace layer that are provided on one side of the transparent-trace layer that is further away from the substrate base plate, wherein the fifth insulating layer is provided closer to the transparent-trace layer, the fifth metal-trace layer comprises a plurality of fifth metal traces, orthographic projections of the fifth metal traces on the substrate base plate are located within the non-light transmission regions of different instances of the pixel regions, each two neighboring instances of the fifth metal traces are connected by one of the fifth transparent traces, and the fifth metal traces and the fifth transparent traces are connected by via holes provided in the fifth insulating layer.

In an optional implementation, the displaying base plate located within the transparent displaying region further comprises: an anode insulating layer and an anode layer that are provided on one side of the fifth metal-trace layer that is further away from the substrate base plate, the anode insulating layer is provided closer to the fifth metal-trace layer, the anode layer comprises a plurality of anodes, the anodes are connected to different instances of the fifth metal traces by via holes provided in the anode insulating layer, and orthographic projections of the anodes on the substrate base plate cover the non-light transmission regions of different instances of the pixel regions.

In an optional implementation, the first transparent traces, the fourth transparent traces and the fifth transparent traces are insulated from each other; and the first metal traces, the fourth metal traces and the fifth metal traces are connected to a driving circuit in each of the pixel regions.

In an optional implementation, a material of the transparent-trace layer is a metal, a metal oxide, an inorganic material, an organic material or a composite material.

The present disclosure further discloses a displaying device, wherein the displaying device comprises a camera and the displaying base plate according to any one of the above embodiments, and an orthographic projection of the camera on the displaying base plate is located within the transparent displaying region.

The present disclosure further discloses a fabricating method of a displaying base plate, wherein the displaying base plate comprises a transparent displaying region, and the fabricating method of the displaying base plate located within the transparent displaying region comprises:

providing a substrate base plate, wherein the substrate base plate comprises a plurality of pixel regions, and each of the pixel regions comprises a light transmission region and a non-light transmission region; and forming sequentially a transparent-trace layer, a first insulating layer and a first metal-trace layer on one side of the substrate base plate, or forming sequentially a first metal-trace layer, a first insulating layer and a transparent-trace layer on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer.

In an optional implementation, the step of providing the substrate base plate comprises:

providing a first substrate;

by using a first patterning process, forming a second metal-trace layer on one side of the first substrate that is closer to the transparent-trace layer; and by using a second patterning process, forming a second insulating layer on one side of the second metal-trace layer that is closer to the transparent-trace layer.

In an optional implementation, the step of forming sequentially the transparent-trace layer, the first insulating layer and the first metal-trace layer on the one side of the substrate base plate comprises:

forming sequentially the transparent-trace layer, the first insulating layer and the first metal-trace layer on one side of the second insulating layer that is further away from the first substrate;

wherein the transparent-trace layer further comprises a plurality of second transparent traces, the second metal-trace layer comprises a plurality of second metal traces, the second metal traces are located within the non-light transmission regions of different instances of the pixel regions, each two neighboring instances of the second metal traces are connected by one of the second transparent traces, and the second metal traces and the second transparent traces are connected by via holes provided in the second insulating layer.

In an optional implementation, the transparent-trace layer further comprises a plurality of third transparent traces, and after the step of forming sequentially the transparent-trace layer, the first insulating layer and the first metal-trace layer on the one side of the second insulating layer that is further away from the first substrate, the method further comprises:

forming sequentially a third insulating layer and a third metal-trace layer on one side of the first metal-trace layer that is further away from the substrate base plate, wherein the third metal-trace layer comprises a plurality of third metal traces, orthographic projections of the third metal traces on the substrate base plate are located within the non-light transmission regions of different instances of the pixel regions, each two neighboring instances of the third metal traces are connected by one of the third transparent traces, and the third metal traces and the third transparent traces are connected by via holes provided in the third insulating layer and the first insulating layer.

In an optional implementation, after the step of forming sequentially the third insulating layer and the third metal-trace layer on the one side of the first metal-trace layer that is further away from the substrate base plate, the method further comprises:

forming sequentially an anode insulating layer and an anode layer on one side of the third metal-trace layer that is further away from the substrate base plate, wherein the anode layer comprises a plurality of anodes, the anodes are connected to different instances of the third metal traces by via holes provided in the anode insulating layer, and orthographic projections of the anodes on the substrate base plate cover the non-light transmission regions of different instances of the pixel regions.

In an optional implementation, the step of providing the substrate base plate comprises:

providing a second substrate;

by using a third patterning process, forming a fourth metal-trace layer on one side of the second substrate that is closer to the transparent-trace layer; and by using a film-formation process, forming a fourth insulating layer on one side of the fourth metal-trace layer that is further away from the second substrate.

In an optional implementation, the step of forming sequentially the first metal-trace layer, the first insulating layer and the transparent-trace layer on the one side of the substrate base plate comprises:

forming sequentially the first metal-trace layer, the first insulating layer and the transparent-trace layer on one side of the fourth insulating layer that is further away from the second substrate;

wherein the transparent-trace layer further comprises a plurality of fourth transparent traces, the fourth metal-trace layer comprises a plurality of fourth metal traces, the fourth metal traces are located within the non-light transmission regions of different instances of the pixel regions, each two neighboring instances of the fourth metal traces are connected by one of the fourth transparent traces, and the fourth metal traces and the fourth transparent traces are connected by via holes provided in the first insulating layer and the fourth insulating layer.

In an optional implementation, the transparent-trace layer further comprises a plurality of fifth transparent traces, and after the step of forming sequentially the first metal-trace layer, the first insulating layer and the transparent-trace layer on the one side of the fourth insulating layer that is further away from the second substrate, the method further comprises:

forming sequentially a fifth insulating layer and a fifth metal-trace layer on one side of the transparent-trace layer that is further away from the substrate base plate, wherein the fifth metal-trace layer comprises a plurality of fifth metal traces, orthographic projections of the fifth metal traces on the substrate base plate are located within the non-light transmission regions of different instances of the pixel regions, each two neighboring instances of the fifth metal traces are connected by one of the fifth transparent traces, and the fifth metal traces and the fifth transparent traces are connected by via holes provided in the fifth insulating layer.

In an optional implementation, after the step of forming sequentially the fifth insulating layer and the fifth metal-trace layer on the one side of the transparent-trace layer that is further away from the substrate base plate, the method further comprises:

forming sequentially an anode insulating layer and an anode layer on one side of the fifth metal-trace layer that is further away from the substrate base plate, wherein the anode layer comprises a plurality of anodes, the anodes are connected to different instances of the fifth metal traces by via holes provided in the anode insulating layer, and orthographic projections of the anodes on the substrate base plate cover the non-light transmission regions of different instances of the pixel regions.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

FIG. 10 shows a schematic sectional structural diagram of the displaying base plate provided with a fifth metal-trace layer according to an embodiment of the present disclosure;

FIG. 11 shows a flow chart of the steps of the fabricating method of a displaying base plate according to an embodiment of the present disclosure;

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
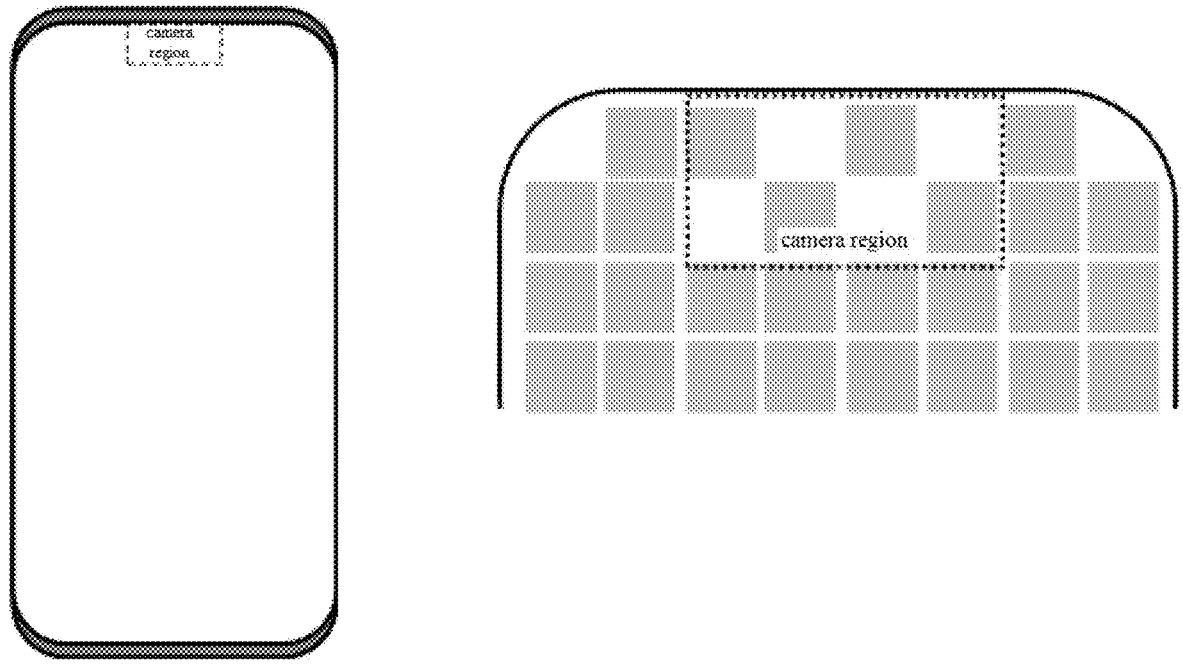
FIG. 1 shows a schematic planar structural diagram of a displaying base plate in the related art.

Currently, the technique of the under-screen camera has already been the irresistible trend. The solutions in the related art are increasing the transmittance of the transparent displaying region by reducing the pixel density of the transparent displaying region. Referring to FIG. 1, the pixel density of the transparent displaying region is 200 ppi, while the pixel density of the effective displaying region is usually between 400 ppi and 600 ppi. Although that can increase the transmittance of the transparent displaying region, that results in a low brightness of that region, and the uniformity of the brightness of the entire display screen is poor.

Figure 2:
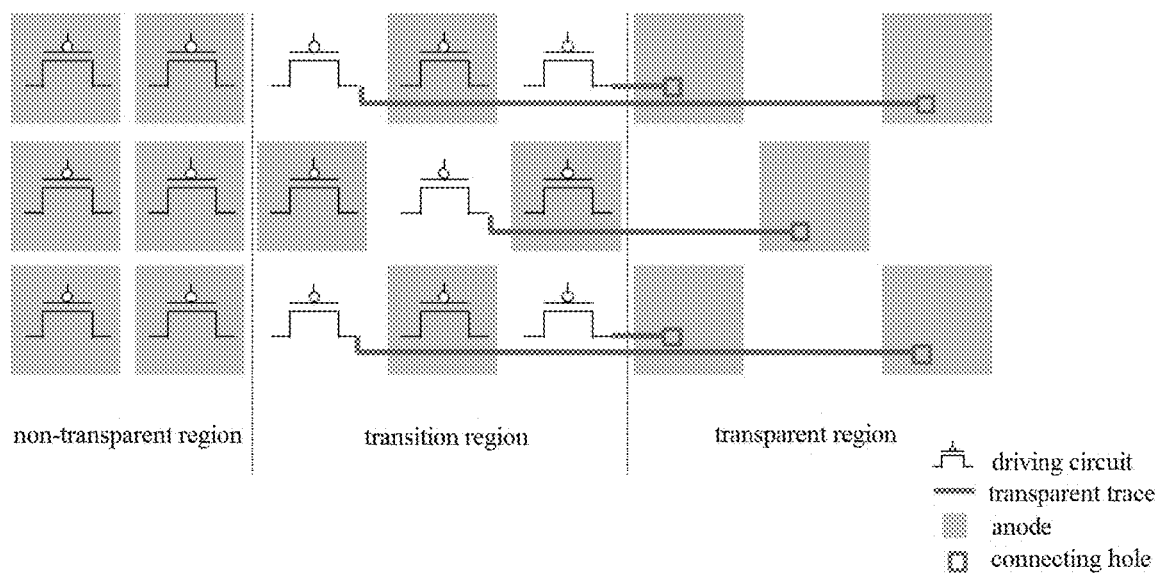
FIG. 2 shows a schematic planar structural diagram of a transparent displaying region in the related art.

As shown in FIG. 2, when the above technical solution is employed, the pixel circuits connected to the anodes in the transparent region are located within a transition region outside the transparent region. Accordingly, each of the anodes in the transparent region is required to be connected to a corresponding pixel circuit by one transparent trace, and when the transparent region is large or the pixel density is high, the quantity of the transparent traces will be very enormous, which highly impacts the designing, the process and the cost.

Figure 3:
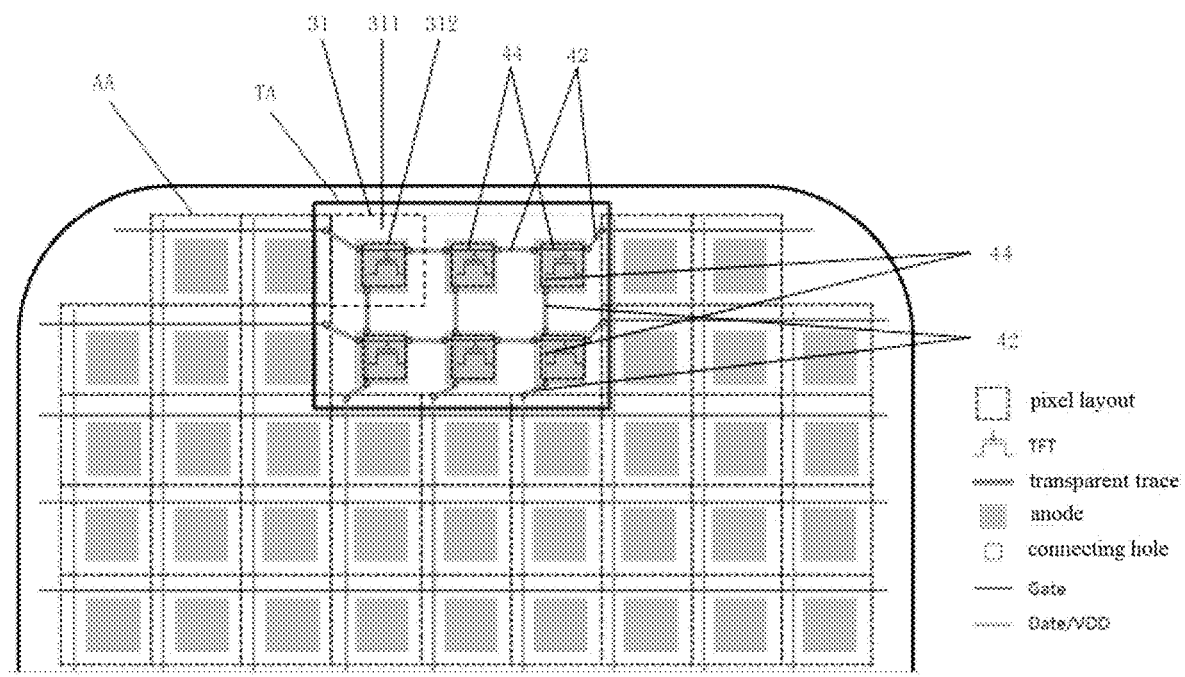
FIG. 3 shows a schematic planar structural diagram of the displaying base plate according to an embodiment of the present disclosure.
Figure 4:
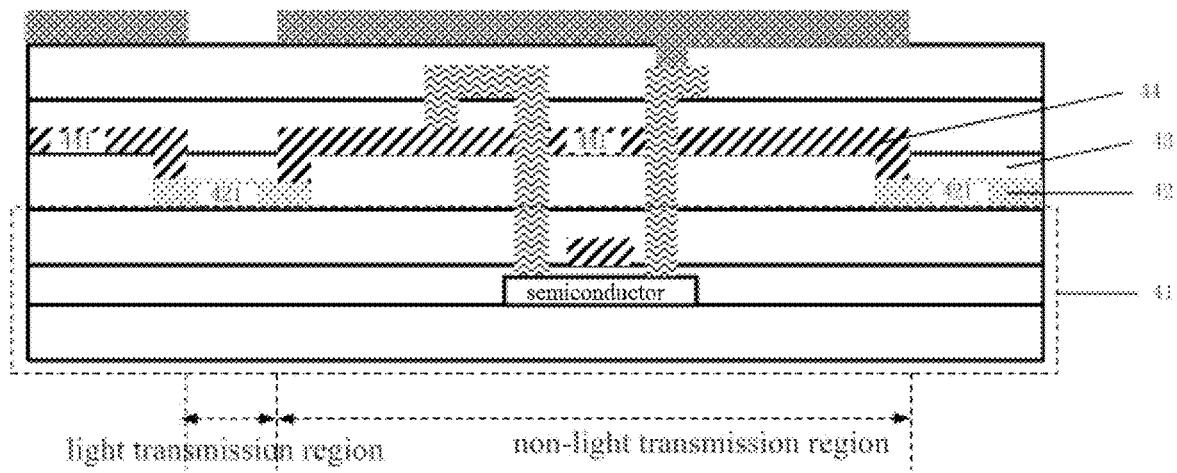
FIG. 4 shows a schematic sectional structural diagram of the first displaying base plate according to an embodiment of the present disclosure.
Figure 5:
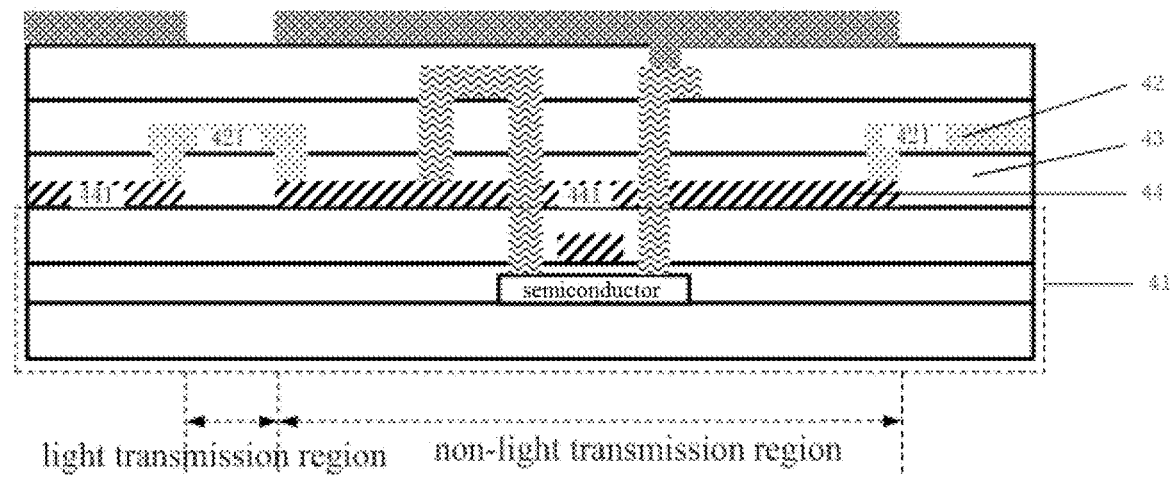
FIG. 5 shows a schematic sectional structural diagram of the second displaying base plate according to an embodiment of the present disclosure.

In order to increase the transmittance of the transparent displaying region, an embodiment of the present disclosure provides a displaying base plate. The displaying base plate comprises a transparent displaying region TA and an effective displaying region AA. Referring to FIG. 3, FIG. 3 shows a schematic planar structural diagram of the displaying base plate. Referring to FIGS. 4 and 5, FIGS. 4 and 5 show a schematic sectional structural diagram of the displaying base plate located within the transparent displaying region. The displaying base plate of the transparent displaying region TA comprises:

a substrate base plate 41, wherein the substrate base plate 41 comprises a plurality of pixel regions 31, and each of the pixel regions 31 comprises a light transmission region 311 and a non-light transmission region 312; and a transparent-trace layer 42, a first insulating layer 43 and a first metal-trace layer 44 that are provided in stack on one side of the substrate base plate 41, wherein the transparent-trace layer 42 comprises a plurality of first transparent traces 421, the first metal-trace layer 44 comprises a plurality of first metal traces 441, the orthographic projections of the first metal traces 441 on the substrate base plate 41 are located within the non-light transmission regions 312 of different pixel regions 31, each two neighboring first metal traces 441 are connected by one of the first transparent traces 421, and the first metal traces 441 and the first transparent traces 421 are connected by via holes provided in the first insulating layer 43.

Referring to FIG. 4, FIG. 4 shows a schematic sectional structural diagram of the first displaying base plate located within the transparent displaying region, wherein the transparent-trace layer 42 shown in FIG. 4 is provided closer to the substrate base plate 41. Referring to FIG. 5, FIG. 5 shows a schematic sectional structural diagram of the second displaying base plate located within the transparent displaying region, wherein the first metal-trace layer 44 shown in FIG. 5 is provided closer to the substrate base plate 41.

Referring to FIGS. 4 and 5, all of the orthographic projections on the substrate base plate 41 of the first metal traces 441 and of the via holes for connecting them to the first transparent traces 421 are located within the non-light transmission regions 312. Each two neighboring first metal traces 441 are connected by one of the first transparent traces 421 and the via holes, two neighboring first metal traces 441 are located within different non-light transmission regions 312, and the first transparent trace 421 connecting two neighboring first metal traces 441 corresponds to the light transmission region 311 between two neighboring non-light transmission regions 312.

The first metal traces 441 may be data lines Data or VDD lines. Referring to FIG. 3, FIG. 3 shows a solution of the connection between the transparent displaying region and the effective displaying region. The longitudinal data lines Data or VDD lines, when entering the transparent displaying region TA, perform layer switching via perforations to the transparent-trace layer 42, perform layer switching to the first metal-trace layer 44 when entering the first row of the non-light transmission regions 312 of the transparent displaying region TA, perform layer switching to the transparent-trace layer 42 when entering the light transmission region 311 between the first row and the second row of the non-light transmission regions 312, perform layer switching to the first metal-trace layer 44 when re-entering the second row of the non-light transmission regions 312, and repeat the routine.

The first metal traces 441 may also be scanning-signal lines gate. Referring to FIG. 3, the transverse scanning-signal lines gate, when entering the transparent displaying region TA, perform layer switching via perforations to the transparent-trace layer 42, perform layer switching to the first metal-trace layer 44 when entering the first column of the non-light transmission regions 312 of the transparent displaying region TA, perform layer switching to the transparent-trace layer 42 when entering the light transmission region 311 between the first column and the second column of the non-light transmission regions 312, perform layer switching to the first metal-trace layer 44 when re-entering the second column of the non-light transmission regions 312, and repeat the routine.

It should be noted that the first metal traces 441 may also be any signal lines in the transparent displaying region TA, such as initialized signal $V_{init}$ lines. For example, the Data or VDD traces employ SD traces in the non-light transmission regions 312, and perform layer switching in the light transmission region 311 to the transparent-trace layer 42 for the wiring; the Gate signals employ Gate 1 traces in the non-light transmission regions 312, and perform layer switching in the light transmission region 311 to the transparent-trace layer 42 for the wiring; and the $V_{init}$ signals employ Gate 2 traces in the non-light transmission regions 312, and perform layer switching in the light transmission region 311 to the transparent-trace layer 42 for the wiring.

In conclusion, any signal lines within the transparent displaying region TA, in the non-light transmission regions 312 of each of the pixel regions 31, may employ the first metal traces 441 in the first metal-trace layer 44, perform layer switching in the light transmission region 311 of each of the pixel regions 31 to the transparent-trace layer 42, and employ the first transparent traces 421 for the wiring.

The displaying base plate according to the present embodiment, by providing the non-transparent metal traces merely in the non-light transmission region of each of the pixel regions in the transparent displaying region, and providing the transparent traces in the light transmission region, increases the transmittance of the transparent displaying region.

In addition, by using the displaying base plate according to the technical solutions of the present disclosure, each of the pixel regions 31 of the substrate base plate 41 can comprise a driving circuit, and the driving circuits are located within the non-light transmission regions 312. In order to increase the transmittance of the transparent displaying region, the driving circuits may be simplified circuits, such as 3T1C and 2T2C. Accordingly, because each of the pixel regions within the transparent displaying region TA is provided with a driving circuit, trace connection between the anodes and the pixel circuits can be avoided, which reduces the difficulty in the designing and the process and reduces the cost.

Figure 6:
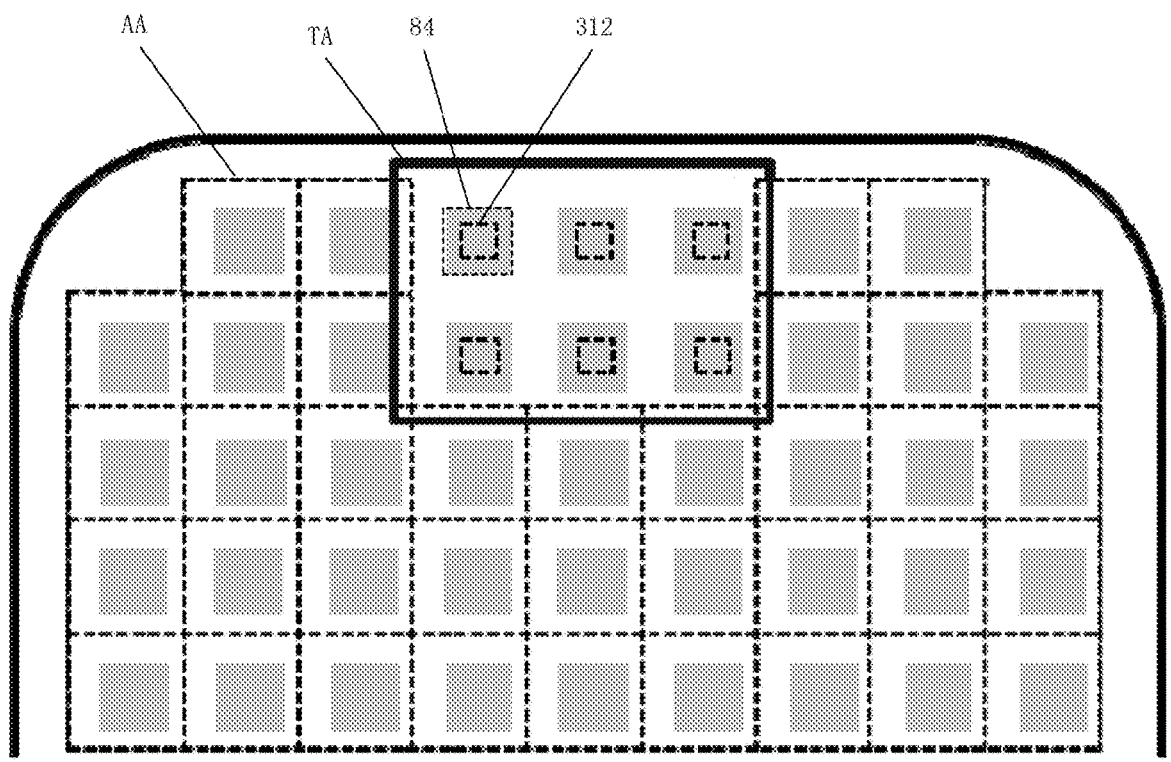
FIG. 6 shows a schematic planar structural diagram of the displaying base plate provided with an anode layer according to an embodiment of the present disclosure.
Figure 8:
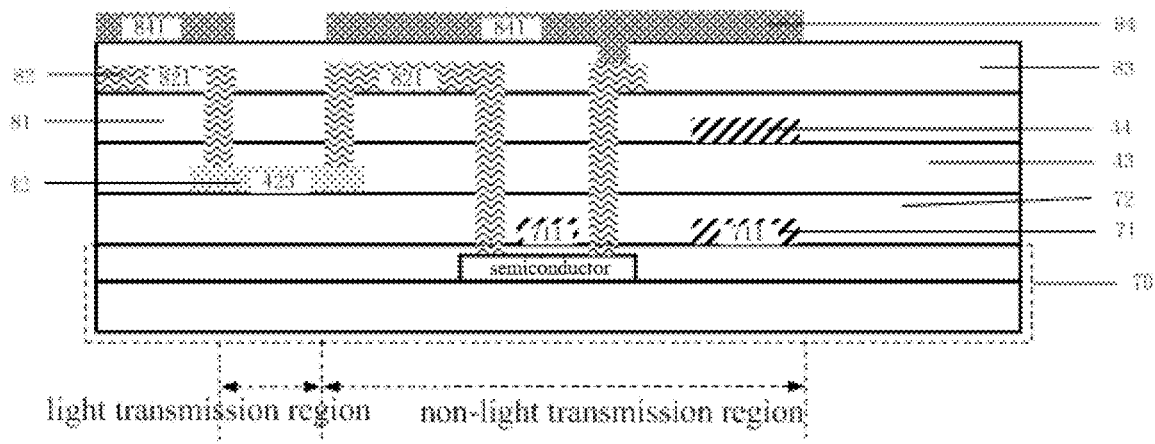
FIG. 8 shows a schematic sectional structural diagram of the displaying base plate provided with a third metal-trace layer according to an embodiment of the present disclosure.

In an optional implementation, referring to FIGS. 8 and 10, the displaying base plate of the transparent displaying region TA may further comprise: an anode insulating layer 83 and an anode layer 84 that are provided on one side of the first metal-trace layer 44 (shown in FIG. 8) or the transparent-trace layer 42 (shown in FIG. 10) that is further away from the substrate base plate 41, wherein the orthographic projection of the anode layer 84 on the substrate base plate 41 may cover the non-light transmission regions 312. Referring to FIG. 6, FIG. 6 shows a schematic planar structural diagram of a displaying base plate provided with an anode layer.

Figure 7:
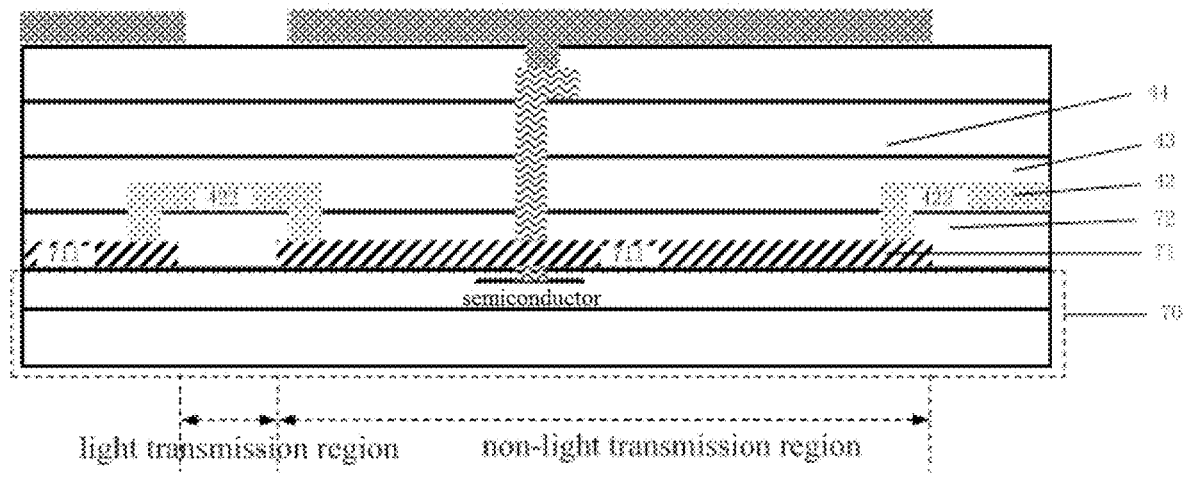
FIG. 7 shows a schematic sectional structural diagram of the displaying base plate provided with a second metal-trace layer according to an embodiment of the present disclosure.

In an optional implementation, the transparent-trace layer 42 is provided closer to the substrate base plate 41, referring to FIG. 7, the transparent-trace layer 42 may further comprise a plurality of second transparent traces 422, and the substrate base plate 41 may comprise:

a first substrate 70, a second metal-trace layer 71 and a second insulating layer 72 that are provided in stack on one side of the first substrate 70 that is closer to the transparent-trace layer 42, wherein the second metal-trace layer 71 is provided closer to the first substrate 70, the transparent-trace layer 42 is provided closer to the second insulating layer 72, the second metal-trace layer 71 comprises a plurality of second metal traces 711, the second metal traces 711 are located within the non-light transmission regions 312 of different pixel regions 31, each two neighboring second metal traces 711 are connected by one of the second transparent traces 422, and the second metal traces 711 and the second transparent traces 422 are connected by via holes provided in the second insulating layer 72.

The first substrate 70 may comprise, for example, a glass base plate or flexible base plate, a driving circuit (the semiconductor shown in FIG. 7) provided on the glass base plate or flexible base plate, and an insulating layer provided on the driving circuit, and the second metal-trace layer 71 is provided on the insulating layer.

Optionally, referring to FIG. 8, the transparent-trace layer 42 may further comprise a plurality of third transparent traces 423, and the displaying base plate of the transparent displaying region TA may further comprise:

a third insulating layer 81 and a third metal-trace layer 82 that are provided in stack on one side of the first metal-trace layer 44 that is further away from the substrate base plate 41, wherein the third insulating layer 81 is provided closer to the first metal-trace layer 44, the third metal-trace layer 82 comprises a plurality of third metal traces 821, the orthographic projections of the third metal traces 821 on the substrate base plate 41 are located within the non-light transmission regions 312 of different pixel regions 31, each two neighboring third metal traces 821 are connected by one of the third transparent traces 423, and the third metal traces 821 and the third transparent traces 423 are connected by via holes provided in the third insulating layer 81 and the first insulating layer 43.

Referring to FIG. 8, the displaying base plate of the transparent displaying region TA may further comprise: an anode insulating layer 83 and an anode layer 84 that are provided in stack on one side of the third metal-trace layer 82 that is further away from the substrate base plate 41, the anode insulating layer 83 is provided closer to the third metal-trace layer 82, the anode layer 84 comprises a plurality of anodes 841, the anodes 841 are connected to different third metal traces 821 by via holes provided in the anode insulating layer 83, and the orthographic projections of the anodes 841 on the substrate base plate 41 cover the non-light transmission regions 312 of different pixel regions 31.

In the present implementation, the first transparent traces 421, the second transparent traces 422 and the third transparent traces 423 are insulated from each other. The first metal traces 441, the second metal traces 711 and the third metal traces 821 may be connected to the driving circuit in each of the pixel regions 31. The first metal traces 441 may be Gate 2 traces. The second metal traces 711 may be Gate 1 traces. The third metal traces 821 may be SD traces.

Figure 9:
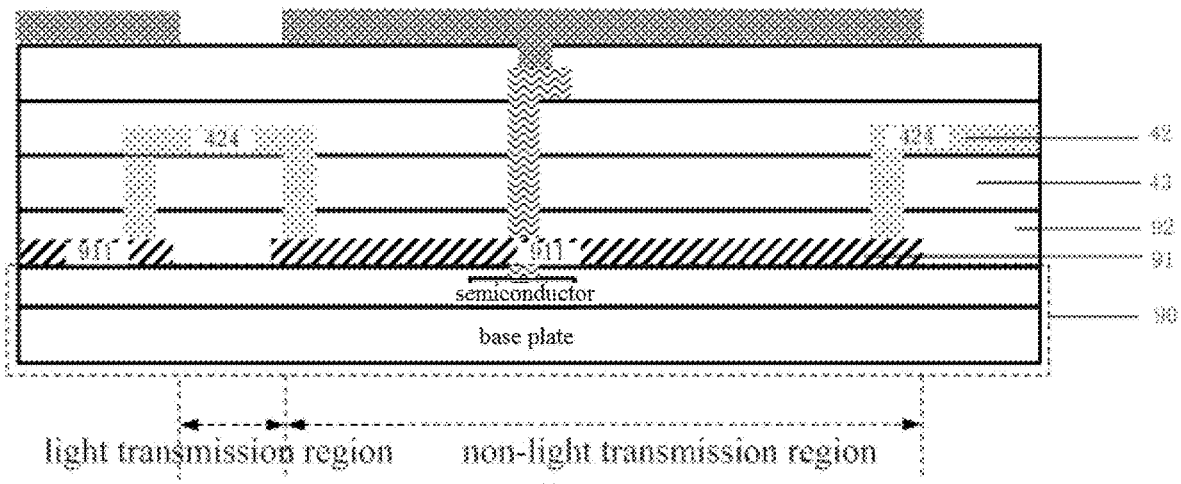
FIG. 9 shows a schematic sectional structural diagram of the displaying base plate provided with a fourth metal-trace layer according to an embodiment of the present disclosure.

In another optional implementation, the first metal-trace layer 44 is provided closer to the substrate base plate 41, referring to FIG. 9, the transparent-trace layer 42 may further comprise a plurality of fourth transparent traces 424, and the substrate base plate 41 may comprise:

a second substrate 90, and a fourth metal-trace layer 91 and a fourth insulating layer 92 that are provided in stack on one side of the second substrate 90 that is closer to the transparent-trace layer 42, wherein the fourth metal-trace layer 91 is provided closer to the second substrate 90, the first metal-trace layer 44 is provided closer to the fourth insulating layer 92 (in other words, the transparent-trace layer 42 is provided further away from the fourth insulating layer 92; the first metal-trace layer 44 is not shown in the sectional view of FIG. 9), the fourth metal-trace layer 91 comprises a plurality of fourth metal traces 911, the fourth metal traces 911 are located within the non-light transmission regions 312 of different pixel regions 31, each two neighboring fourth metal traces 911 are connected by one of the fourth transparent traces 424, and the fourth metal traces 911 and the fourth transparent traces 424 are connected by via holes provided in the first insulating layer 43 and the fourth insulating layer 92.

The second substrate 90 may comprise, for example, a glass base plate or flexible base plate, a driving circuit (the semiconductor shown in FIG. 9) provided on the glass base plate or flexible base plate, and an insulating layer provided on the driving circuit, and the fourth metal-trace layer 91 is provided on the insulating layer.

Optionally, referring to FIG. 10, the transparent-trace layer 42 may further comprise a plurality of fifth transparent traces 425, and the displaying base plate of the transparent displaying region TA may further comprise:

a fifth insulating layer 101 and a fifth metal-trace layer 102 that are provided in stack on one side of the transparent-trace layer 42 that is further away from the substrate base plate 41, wherein the fifth insulating layer 101 is provided closer to the transparent-trace layer 42, the fifth metal-trace layer 102 comprises a plurality of fifth metal traces 1021, the orthographic projections of the fifth metal traces 1021 on the substrate base plate 41 are located within the non-light transmission regions 312 of different pixel regions 31, each two neighboring fifth metal traces 1021 are connected by one of the fifth transparent traces 425, and the fifth metal traces 1021 and the fifth transparent traces 425 are connected by via holes provided in the fifth insulating layer 101.

Referring to FIG. 10, the displaying base plate of the transparent displaying region TA further comprises: an anode insulating layer 83 and an anode layer 84 that are provided in stack on one side of the fifth metal-trace layer 102 that is further away from the substrate base plate 41, the anode insulating layer 83 is provided closer to the fifth metal-trace layer 102, the anode layer 84 comprises a plurality of anodes 841, the anodes 841 are connected to different fifth metal traces 1021 by via holes provided in the anode insulating layer 83, and the orthographic projections of the anodes 841 on the substrate base plate 41 cover the non-light transmission regions 312 of different pixel regions 31.

In the present implementation, the first transparent traces 421, the fourth transparent traces 424 and the fifth transparent traces 425 are insulated from each other. The first metal traces 441, the fourth metal traces 911 and the fifth metal traces 1021 may be connected to the driving circuit in each of the pixel regions 31. The first metal traces 441 may be Gate 2 traces. The fourth metal traces 911 may be Gate 1 traces. The fifth metal traces 1021 may be SD traces.

The material of the transparent-trace layer 42 according to the present embodiment may be a metal, a metal oxide, an inorganic material, an organic material or a composite material and so on. For example, the material of the transparent-trace layer 42 may be ITO, IZO, carbon nanotube or graphene and so on. The film-formation process of the transparent-trace layer 42 may be CVD, spread coating and so on. The patterning may employ a lithography process, laser processing and so on.

Another embodiment of the present disclosure further provides a displaying device, wherein the displaying device comprises a camera and the displaying base plate according to any one of the above embodiments, and an orthographic projection of the camera on the displaying base plate is located within the transparent displaying region.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Another embodiment of the present disclosure further provides a fabricating method of a displaying base plate, wherein the displaying base plate comprises a transparent displaying region, and referring to FIG. 11, and the fabricating method of the displaying base plate located within the transparent displaying region comprises:

Step 111: providing a substrate base plate, wherein the substrate base plate comprises a plurality of pixel regions, and each of the pixel regions comprises a light transmission region and a non-light transmission region; and Step 112: forming sequentially a transparent-trace layer, a first insulating layer and a first metal-trace layer on one side of the substrate base plate, or forming sequentially a first metal-trace layer, a first insulating layer and a transparent-trace layer on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer.

By using the fabricating method according to the present embodiment, the displaying base plate according to any one of the above embodiments can be obtained.

The material of the transparent-trace layer according to the present embodiment may be a metal, a metal oxide, an inorganic material, an organic material or a composite material and so on. For example, the material of the transparent-trace layer 42 may be ITO, IZO, carbon nanotube or graphene and so on. The film-formation process of the transparent-trace layer 42 may be CVD, spread coating and so on. The patterning may employ a lithography process, laser processing and so on.

Figure 12:
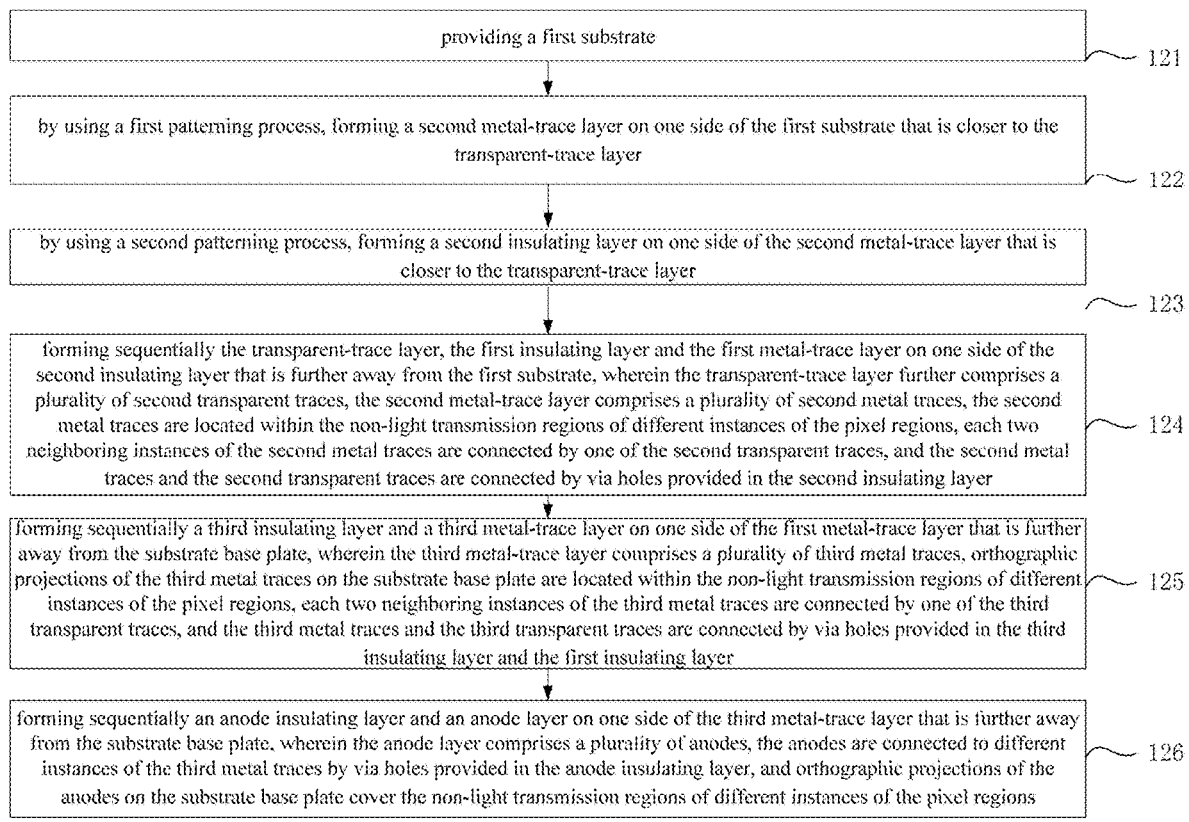
FIG. 12 shows a flow chart of the steps of the first fabrication implementation according to an embodiment of the present disclosure.

In an optional implementation of the present embodiment, referring to FIG. 12, the step 111 may comprise:

Step 121: providing a first substrate;

Step 122: by using a first patterning process, forming a second metal-trace layer on one side of the first substrate that is closer to the transparent-trace layer; and Step 123: by using a second patterning process, forming a second insulating layer on one side of the second metal-trace layer that is closer to the transparent-trace layer.

In the present implementation, the step 112 may comprise:

Step 124: forming sequentially the transparent-trace layer, the first insulating layer and the first metal-trace layer on one side of the second insulating layer that is further away from the first substrate, wherein the transparent-trace layer further comprises a plurality of second transparent traces, the second metal-trace layer comprises a plurality of second metal traces, the second metal traces are located within the non-light transmission regions of different instances of the pixel regions, each two neighboring instances of the second metal traces are connected by one of the second transparent traces, and the second metal traces and the second transparent traces are connected by via holes provided in the second insulating layer.

Optionally, the transparent-trace layer further comprises a plurality of third transparent traces, and after the step 123, the method may further comprise:

Step 125: forming sequentially a third insulating layer and a third metal-trace layer on one side of the first metal-trace layer that is further away from the substrate base plate, wherein the third metal-trace layer comprises a plurality of third metal traces, orthographic projections of the third metal traces on the substrate base plate are located within the non-light transmission regions of different instances of the pixel regions, each two neighboring instances of the third metal traces are connected by one of the third transparent traces, and the third metal traces and the third transparent traces are connected by via holes provided in the third insulating layer and the first insulating layer; and Step 126: forming sequentially an anode insulating layer and an anode layer on one side of the third metal-trace layer that is further away from the substrate base plate, wherein the anode layer comprises a plurality of anodes, the anodes are connected to different instances of the third metal traces by via holes provided in the anode insulating layer, and orthographic projections of the anodes on the substrate base plate cover the non-light transmission regions of different instances of the pixel regions.

Figure 13:
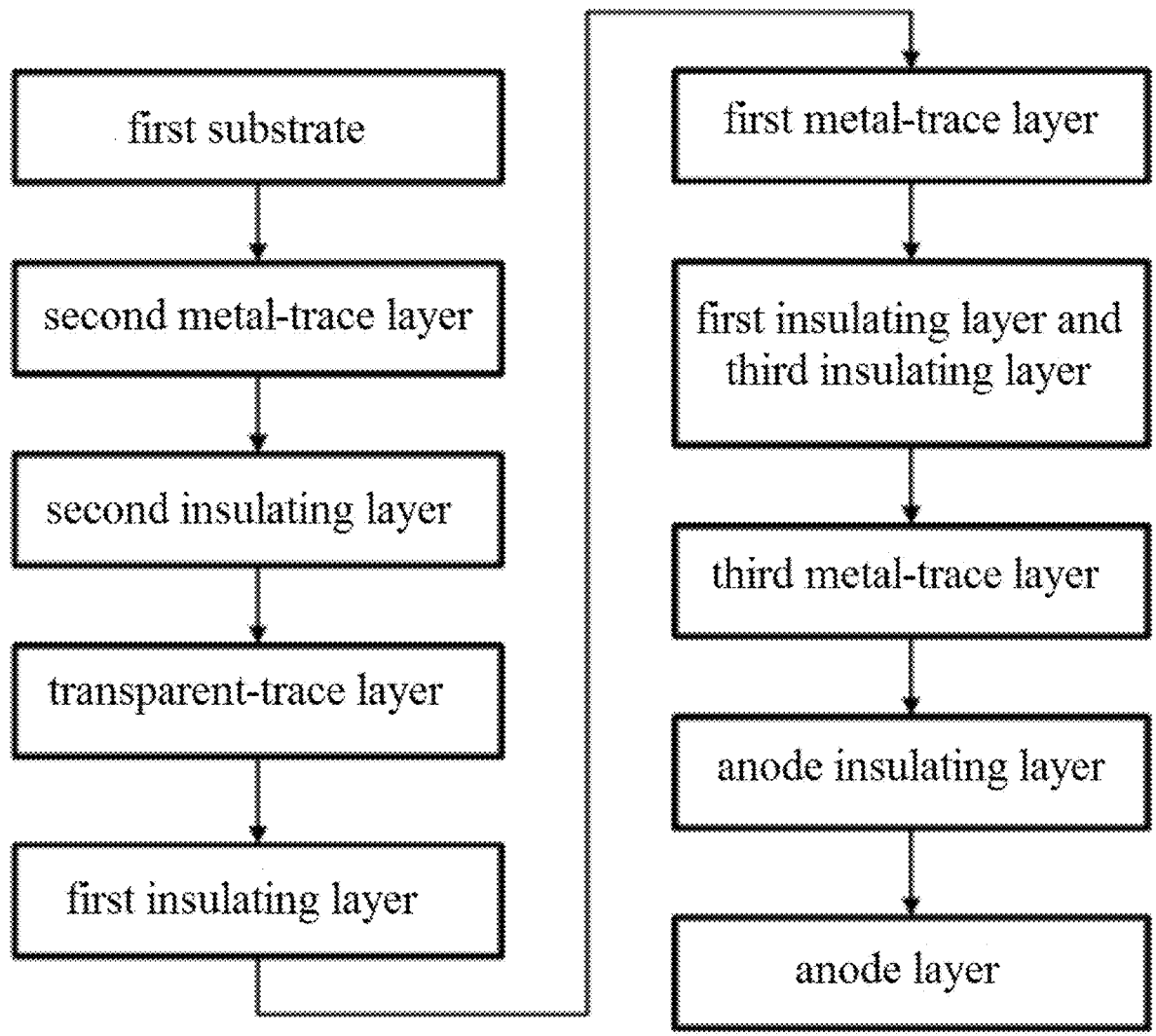
FIG. 13 shows a flow chart of the etching process of the first fabrication implementation according to an embodiment of the present disclosure.

Referring to FIG. 13, FIG. 13 shows a flow chart of the etching process of the fabricating method according to the present implementation. FIGS. 4, 7 and 8 show a schematic sectional structural diagram of the displaying base plate obtained by using the fabricating method according to the present implementation.

Figure 14:
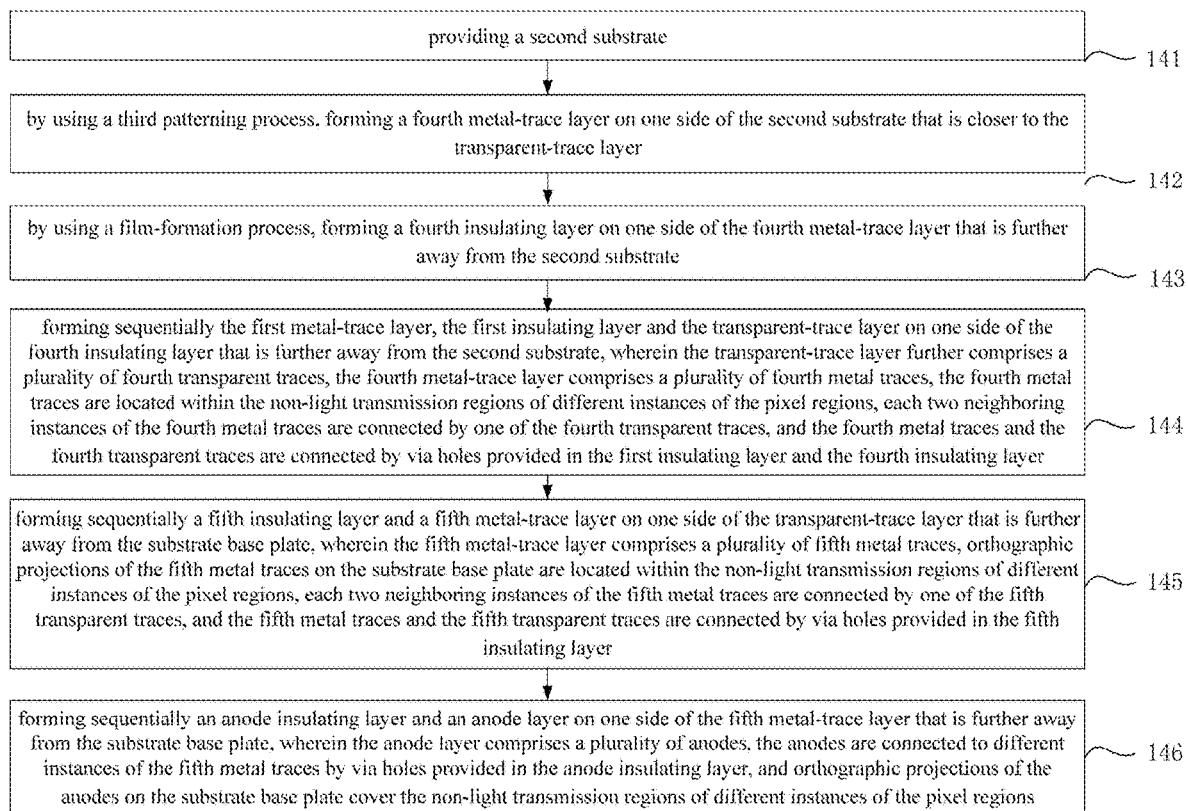
FIG. 14 shows a flow chart of the steps of the second fabrication implementation according to an embodiment of the present disclosure.

In another optional implementation of the present embodiment, referring to FIG. 14, the step 111 may comprise:

Step 141: providing a second substrate;

Step 142: by using a third patterning process, forming a fourth metal-trace layer on one side of the second substrate that is closer to the transparent-trace layer; and Step 143: by using a film-formation process, forming a fourth insulating layer on one side of the fourth metal-trace layer that is further away from the second substrate.

In the present implementation, the step 112 may comprise:

Step 144: forming sequentially the first metal-trace layer, the first insulating layer and the transparent-trace layer on one side of the fourth insulating layer that is further away from the second substrate, wherein the transparent-trace layer further comprises a plurality of fourth transparent traces, the fourth metal-trace layer comprises a plurality of fourth metal traces, the fourth metal traces are located within the non-light transmission regions of different instances of the pixel regions, each two neighboring instances of the fourth metal traces are connected by one of the fourth transparent traces, and the fourth metal traces and the fourth transparent traces are connected by via holes provided in the first insulating layer and the fourth insulating layer.

Optionally, the transparent-trace layer further comprises a plurality of fifth transparent traces, and after the step 143, the method may further comprise:

Step 145: forming sequentially a fifth insulating layer and a fifth metal-trace layer on one side of the transparent-trace layer that is further away from the substrate base plate, wherein the fifth metal-trace layer comprises a plurality of fifth metal traces, orthographic projections of the fifth metal traces on the substrate base plate are located within the non-light transmission regions of different instances of the pixel regions, each two neighboring instances of the fifth metal traces are connected by one of the fifth transparent traces, and the fifth metal traces and the fifth transparent traces are connected by via holes provided in the fifth insulating layer; and Step 146: forming sequentially an anode insulating layer and an anode layer on one side of the fifth metal-trace layer that is further away from the substrate base plate, wherein the anode layer comprises a plurality of anodes, the anodes are connected to different instances of the fifth metal traces by via holes provided in the anode insulating layer, and orthographic projections of the anodes on the substrate base plate cover the non-light transmission regions of different instances of the pixel regions.

Figure 15:
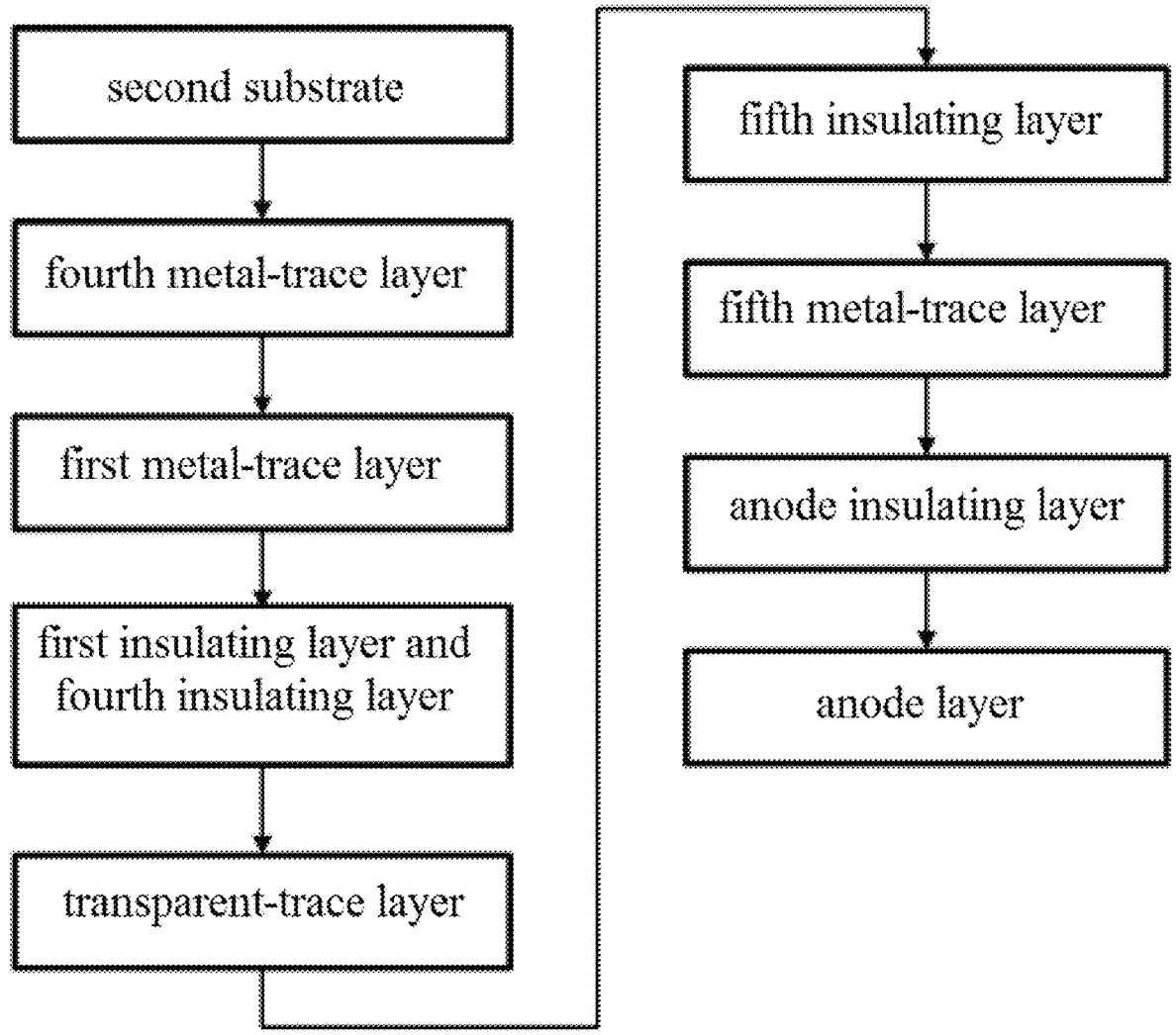
FIG. 15 shows a flow chart of the etching process of the second fabrication implementation according to an embodiment of the present disclosure.

Referring to FIG. 15, FIG. 15 shows a flow chart of the etching process of the fabricating method according to a second implementation. By using the fabricating method shown in FIG. 15, one step of the mask and etching process can be saved, which further reduces the process difficulty, shortens the production cycle, and reduces the cost. FIGS. 5, 9 and 10 show a schematic sectional structural diagram of the displaying base plate obtained by using the fabricating method according to the present implementation.

The technical solutions of the present disclosure provide a fabricating method of a displaying base plate, a displaying base plate and a displaying device, wherein the displaying base plate comprises a transparent displaying region, and the displaying base plate located within the transparent displaying region comprises: a substrate base plate, wherein the substrate base plate comprises a plurality of pixel regions, and each of the pixel regions comprises a light transmission region and a non-light transmission region; and a transparent-trace layer, a first insulating layer and a first metal-trace layer that are provided in stack on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer. The technical solutions of the present disclosure, by providing the first transparent traces within the light transmission region of each of the pixel regions of the transparent displaying region, and providing the non-transparent first metal traces merely in the non-light transmission regions, increase the transmittance of the transparent displaying region.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The fabricating method of the displaying base plate, the displaying base plate and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying base plate, wherein the displaying base plate comprises a transparent displaying region, and the displaying base plate located within the transparent displaying region comprises:

a substrate base plate, wherein the substrate base plate comprises a plurality of pixel regions, and each of the pixel regions comprises a light transmission region and a non-light transmission region; and a transparent-trace layer, a first insulating layer and a first metal-trace layer that are provided in stack on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer.

2. The displaying base plate according to claim 1, wherein the transparent-trace layer further comprises a plurality of second transparent traces, and the substrate base plate comprises:
a first substrate, and a second metal-trace layer and a second insulating layer that are provided on one side of the first substrate that is closer to the transparent-trace layer, wherein the second metal-trace layer is provided closer to the first substrate, the transparent-trace layer is provided closer to the second insulating layer, the second metal-trace layer comprises a plurality of second metal traces, the second metal traces are located within the non-light transmission regions of different instances of the pixel regions, each two neighboring instances of the second metal traces are connected by one of the second transparent traces, and the second metal traces and the second transparent traces are connected by via holes provided in the second insulating layer.

3. The displaying base plate according to claim 2, wherein the transparent-trace layer further comprises a plurality of third transparent traces, and the displaying base plate located within the transparent displaying region further comprises:
a third insulating layer and a third metal-trace layer that are provided on one side of the first metal-trace layer that is further away from the substrate base plate, wherein the third insulating layer is provided closer to the first metal-trace layer, the third metal-trace layer comprises a plurality of third metal traces, orthographic projections of the third metal traces on the substrate base plate are located within the non-light transmission regions of different instances of the pixel regions, each two neighboring instances of the third metal traces are connected by one of the third transparent traces, and the third metal traces and the third transparent traces are connected by via holes provided in the third insulating layer and the first insulating layer.

4. The displaying base plate according to claim 3, wherein the displaying base plate located within the transparent displaying region further comprises: an anode insulating layer and an anode layer that are provided on one side of the third metal-trace layer that is further away from the substrate base plate, wherein the anode insulating layer is provided closer to the third metal-trace layer, the anode layer comprises a plurality of anodes, the anodes are connected to different instances of the third metal traces by via holes provided in the anode insulating layer, and orthographic projections of the anodes on the substrate base plate cover the non-light transmission regions of different instances of the pixel regions.

5. The displaying base plate according to claim 3, wherein the first transparent traces, the second transparent traces and the third transparent traces are insulated from each other; and
the first metal traces, the second metal traces and the third metal traces are connected to a driving circuit in each of the pixel regions.

6. The displaying base plate according to claim 1, wherein the transparent-trace layer further comprises a plurality of fourth transparent traces, and the substrate base plate comprises:
a second substrate, and a fourth metal-trace layer and a fourth insulating layer that are provided on one side of the second substrate that is closer to the transparent-trace layer, wherein the fourth metal-trace layer is provided closer to the second substrate, the first metal-trace layer is provided closer to the fourth insulating layer, the fourth metal-trace layer comprises a plurality of fourth metal traces, the fourth metal traces are located within the non-light transmission regions of different instances of the pixel regions, each two neighboring instances of the fourth metal traces are connected by one of the fourth transparent traces, and the fourth metal traces and the fourth transparent traces are connected by via holes provided in the first insulating layer and the fourth insulating layer.

7. The displaying base plate according to claim 6, wherein the transparent-trace layer further comprises a plurality of fifth transparent traces, and the displaying base plate located within the transparent displaying region further comprises:
a fifth insulating layer and a fifth metal-trace layer that are provided on one side of the transparent-trace layer that is further away from the substrate base plate, wherein the fifth insulating layer is provided closer to the transparent-trace layer, the fifth metal-trace layer comprises a plurality of fifth metal traces, orthographic projections of the fifth metal traces on the substrate base plate are located within the non-light transmission regions of different instances of the pixel regions, each two neighboring instances of the fifth metal traces are connected by one of the fifth transparent traces, and the fifth metal traces and the fifth transparent traces are connected by via holes provided in the fifth insulating layer.

8. The displaying base plate according to claim 7, wherein the displaying base plate located within the transparent displaying region further comprises: an anode insulating layer and an anode layer that are provided on one side of the fifth metal-trace layer that is further away from the substrate base plate, the anode insulating layer is provided closer to the fifth metal-trace layer, the anode layer comprises a plurality of anodes, the anodes are connected to different instances of the fifth metal traces by via holes provided in the anode insulating layer, and orthographic projections of the anodes on the substrate base plate cover the non-light transmission regions of different instances of the pixel regions.

9. The displaying base plate according to claim 7, wherein the first transparent traces, the fourth transparent traces and the fifth transparent traces are insulated from each other; and
the first metal traces, the fourth metal traces and the fifth metal traces are connected to a driving circuit in each of the pixel regions.

10. The displaying base plate according to claim 1, wherein a material of the transparent-trace layer is a metal, a metal oxide, an inorganic material, an organic material or a composite material.

11. A displaying device, wherein the displaying device comprises a camera and the displaying base plate according to claim 1, and an orthographic projection of the camera on the displaying base plate is located within the transparent displaying region.

12. A fabricating method of a displaying base plate, wherein the displaying base plate comprises a transparent displaying region, and the fabricating method of the displaying base plate located within the transparent displaying region comprises:
providing a substrate base plate, wherein the substrate base plate comprises a plurality of pixel regions, and each of the pixel regions comprises a light transmission region and a non-light transmission region; and
forming sequentially a transparent-trace layer, a first insulating layer and a first metal-trace layer on one side of the substrate base plate, or forming sequentially a first metal-trace layer, a first insulating layer and a transparent-trace layer on one side of the substrate base plate, wherein the transparent-trace layer comprises a plurality of first transparent traces, the first metal-trace layer comprises a plurality of first metal traces, orthographic projections of the first metal traces on the substrate base plate are located within the non-light transmission regions of different instances of the pixel regions, each two neighboring instances of the first metal traces are connected by one of the first transparent traces, and the first metal traces and the first transparent traces are connected by via holes provided in the first insulating layer.

13. The fabricating method according to claim 12, wherein the step of providing the substrate base plate comprises:
providing a first substrate;
by using a first patterning process, forming a second metal-trace layer on one side of the first substrate that is closer to the transparent-trace layer; and
by using a second patterning process, forming a second insulating layer on one side of the second metal-trace layer that is closer to the transparent-trace layer.

14. The fabricating method according to claim 13, wherein the step of forming sequentially the transparent-trace layer, the first insulating layer and the first metal-trace layer on the one side of the substrate base plate comprises:
forming sequentially the transparent-trace layer, the first insulating layer and the first metal-trace layer on one side of the second insulating layer that is further away from the first substrate;
wherein the transparent-trace layer further comprises a plurality of second transparent traces, the second metal-trace layer comprises a plurality of second metal traces, the second metal traces are located within the non-light transmission regions of different instances of the pixel regions, each two neighboring instances of the second metal traces are connected by one of the second transparent traces, and the second metal traces and the second transparent traces are connected by via holes provided in the second insulating layer.

15. The fabricating method according to claim 14, wherein the transparent-trace layer further comprises a plurality of third transparent traces, and after the step of forming sequentially the transparent-trace layer, the first insulating layer and the first metal-trace layer on the one side of the second insulating layer that is further away from the first substrate, the method further comprises:
forming sequentially a third insulating layer and a third metal-trace layer on one side of the first metal-trace layer that is further away from the substrate base plate, wherein the third metal-trace layer comprises a plurality of third metal traces, orthographic projections of the third metal traces on the substrate base plate are located within the non-light transmission regions of different instances of the pixel regions, each two neighboring instances of the third metal traces are connected by one of the third transparent traces, and the third metal traces and the third transparent traces are connected by via holes provided in the third insulating layer and the first insulating layer.

16. The fabricating method according to claim 15, wherein after the step of forming sequentially the third insulating layer and the third metal-trace layer on the one side of the first metal-trace layer that is further away from the substrate base plate, the method further comprises:
forming sequentially an anode insulating layer and an anode layer on one side of the third metal-trace layer that is further away from the substrate base plate, wherein the anode layer comprises a plurality of anodes, the anodes are connected to different instances of the third metal traces by via holes provided in the anode insulating layer, and orthographic projections of the anodes on the substrate base plate cover the non-light transmission regions of different instances of the pixel regions.

17. The fabricating method according to claim 12, wherein the step of providing the substrate base plate comprises:
providing a second substrate;
by using a third patterning process, forming a fourth metal-trace layer on one side of the second substrate that is closer to the transparent-trace layer; and
by using a film-formation process, forming a fourth insulating layer on one side of the fourth metal-trace layer that is further away from the second substrate.

18. The fabricating method according to claim 17, wherein the step of forming sequentially the first metal-trace layer, the first insulating layer and the transparent-trace layer on the one side of the substrate base plate comprises:
forming sequentially the first metal-trace layer, the first insulating layer and the transparent-trace layer on one side of the fourth insulating layer that is further away from the second substrate;
wherein the transparent-trace layer further comprises a plurality of fourth transparent traces, the fourth metal-trace layer comprises a plurality of fourth metal traces, the fourth metal traces are located within the non-light transmission regions of different instances of the pixel regions, each two neighboring instances of the fourth metal traces are connected by one of the fourth transparent traces, and the fourth metal traces and the fourth transparent traces are connected by via holes provided in the first insulating layer and the fourth insulating layer.

19. The fabricating method according to claim 18, wherein the transparent-trace layer further comprises a plurality of fifth transparent traces, and after the step of forming sequentially the first metal-trace layer, the first insulating layer and the transparent-trace layer on the one side of the fourth insulating layer that is further away from the second substrate, the method further comprises:
forming sequentially a fifth insulating layer and a fifth metal-trace layer on one side of the transparent-trace layer that is further away from the substrate base plate, wherein the fifth metal-trace layer comprises a plurality of fifth metal traces, orthographic projections of the fifth metal traces on the substrate base plate are located within the non-light transmission regions of different instances of the pixel regions, each two neighboring instances of the fifth metal traces are connected by one of the fifth transparent traces, and the fifth metal traces and the fifth transparent traces are connected by via holes provided in the fifth insulating layer.

20. The fabricating method according to claim 19, wherein after the step of forming sequentially the fifth insulating layer and the fifth metal-trace layer on the one side of the transparent-trace layer that is further away from the substrate base plate, the method further comprises:
forming sequentially an anode insulating layer and an anode layer on one side of the fifth metal-trace layer that is further away from the substrate base plate, wherein the anode layer comprises a plurality of anodes, the anodes are connected to different instances of the fifth metal traces by via holes provided in the anode insulating layer, and orthographic projections of the anodes on the substrate base plate cover the non-light transmission regions of different instances of the pixel regions.

\* \* \* \* \*